(12) United States Patent
Parikh et al.

(10) Patent No.: US 7,562,333 B2
(45) Date of Patent: Jul. 14, 2009

(54) METHOD AND PROCESS FOR GENERATING AN OPTICAL PROXIMITY CORRECTION MODEL BASED ON LAYOUT DENSITY

(75) Inventors: Ashesh Parikh, Frisco, TX (US); Jarvis Jacobs, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 769 days.

(21) Appl. No.: 11/021,044

(22) Filed: Dec. 23, 2004

(65) Prior Publication Data
US 2006/0141366 A1 Jun. 29, 2006

(51) Int. Cl.
G06F 17/50 (2006.01)

(52) U.S. Cl. ............... 716/19; 716/20; 716/21; 430/5; 703/2; 438/14

(58) Field of Classification Search ............. 716/19–21; 430/5; 703/2; 438/14
See application file for complete search history.

(56) References Cited

U.S. PATENT DOCUMENTS

| | | | | |
|---|---|---|---|---|
| 5,965,306 A * | 10/1999 | Mansfield et al. | ............. | 430/22 |
| 6,081,658 A | 6/2000 | Rieger et al. | | |
| 6,083,272 A * | 7/2000 | Nistler et al. | ............. | 716/4 |
| 6,180,293 B1 * | 1/2001 | Tanaka et al. | ............. | 430/5 |
| 6,303,253 B1 * | 10/2001 | Lu | ............. | 430/5 |
| 6,396,569 B2 * | 5/2002 | Zheng et al. | ............. | 355/77 |
| 6,420,077 B1 * | 7/2002 | Chen et al. | ............. | 430/30 |
| 6,510,730 B1 * | 1/2003 | Phan et al. | ............. | 73/105 |
| 6,553,559 B2 | 4/2003 | Liebmann et al. | | |
| 6,571,383 B1 | 5/2003 | Butt et al. | | |
| 6,665,856 B1 * | 12/2003 | Pierrat et al. | ............. | 716/19 |
| 6,760,892 B2 * | 7/2004 | Taoka et al. | ............. | 716/4 |
| 6,794,096 B2 * | 9/2004 | Kroyan | ............. | 430/5 |
| 7,065,738 B1 * | 6/2006 | Kim | ............. | 716/19 |
| 7,246,343 B2 * | 7/2007 | Joshi et al. | ............. | 716/19 |
| 2005/0076321 A1 * | 4/2005 | Smith | ............. | 716/19 |
| 2005/0146714 A1 * | 7/2005 | Kitamura et al. | ............. | 356/237.2 |
| 2005/0219502 A1 * | 10/2005 | Sandstrom et al. | ............. | 355/77 |
| 2005/0221233 A1 * | 10/2005 | Minvielle et al. | ............. | 430/313 |
| 2006/0040187 A1 * | 2/2006 | Troost et al. | ............. | 430/5 |
| 2006/0048091 A1 * | 3/2006 | Joshi et al. | ............. | 716/21 |
| 2008/0081385 A1 * | 4/2008 | Marella et al. | ............. | 438/14 |

* cited by examiner

*Primary Examiner*—Naum B Levin
(74) *Attorney, Agent, or Firm*—Jacqueline J. Garner; Wade J. Brady, III; Frederick J. Telecky, Jr.

(57) ABSTRACT

A method (300) for generating an optical proximity correction model for a mask layout having an asymmetric feature structure includes fabricating a mask (310) having a plurality of symmetric and asymmetric test structures thereon, and image processing one or more semiconductor wafers (320) using the fabricated mask to create a plurality of symmetric and asymmetric resist structures overlying the one or more wafers. At least one critical dimension of the symmetric resist structures and the asymmetric resist structures are measured (330), thereby generating symmetric and asymmetric critical dimension data, and a difference between a desired feature size of the symmetric and asymmetric structures and the measured feature size of the symmetric and asymmetric structures is evaluated (380) in order to generate an optical proximity correction model (398) based thereon.

16 Claims, 3 Drawing Sheets

US 7,562,333 B2

METHOD AND PROCESS FOR GENERATING AN OPTICAL PROXIMITY CORRECTION MODEL BASED ON LAYOUT DENSITY

FIELD OF INVENTION

The present invention relates generally to photolithographic process development, and more particularly to a system and method for optimization of feature sizing based on post process assessment of the density of symmetric and asymmetric measurement data utilized in the manufacture of semiconductor products.

BACKGROUND OF THE INVENTION

Feature sizes of integrated circuits are continuously decreasing in order to increase the packing density of the various semiconductor devices formed thereby. With this size reduction, however, various steps within the integrated circuit fabrication process become more difficult. One such area within the semiconductor fabricating process that experiences unique challenges as feature sizes shrink is photolithography.

Photolithography involves selectively exposing regions of a resist-coated silicon wafer to form a pattern thereon. Once exposure is complete, the exposed resist is developed in order to selectively expose and protect the various regions on the silicon wafer defined by the exposure pattern (e.g., silicon regions in the substrate, polysilicon on the substrate, or insulating layers such as silicon dioxide).

An integral component of photolithography or a pattern transfer system is a reticle (often called a mask) that includes a pattern thereon corresponding to features to be formed in a layer on the substrate. A reticle typically includes a transparent glass plate covered with a patterned light blocking material, such as chrome. The mask is placed between a radiation source producing radiation of a pre-selected wavelength (e.g., ultraviolet light) and a focusing lens which may form part of a stepper or "step and repeat" apparatus. Placed beneath the stepper is the resist-coated silicon wafer. When the radiation from the source is directed onto the reticle, light passes through the glass (in the regions not containing the chrome mask patterns) and projects onto the resist-coated silicon wafer. In this manner, an image of the reticle is transferred to the resist.

The resist (sometimes referred to as the "photoresist") is provided as a thin layer of radiation-sensitive material that is typically spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle.

It is well known in the art of photolithography that light passing through the reticle is refracted and scattered by the edges of the chrome mask patterns of the reticle, causing the projected image to exhibit some rounding and other forms of optical distortion. As feature scaling trends continue, variations of feature critical dimensions may no longer be ignored in present day circuit layouts. The problem highlighted above becomes even more pronounced in integrated circuit designs having submicron feature sizes near the wavelength of the radiation employed in the photolithographic process.

In addition, the diffraction and scattering of the radiation in the distorted illumination pattern propagates through the developed resist pattern and negatively impacts the integrated circuit features, such as polysilicon gate regions, vias in dielectrics, etc. As a result, integrated circuit performance is often degraded.

To mitigate this problem, a reticle correction technique known as optical proximity correction (OPC) has been developed. OPC involves the adding of dark regions to and/or the subtracting of dark regions from portions of a reticle to mitigate the distorting effects of diffraction and scattering. Typically, OPC is performed on a digital representation or simulation of a desired integrated circuit pattern. The digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Various corrections or modifications are made to the base features of the design layout. Some OPC correction takes the form of "serifs." Serifs are typically small, appendage-type addition or subtraction regions typically made at corner regions or other areas on reticle designs to compensate for the optical distortions produced by the imaging effects.

In addition, variations in the photoresist and other such imaging material processing cause damage to the features as fabricated, and degradations from the layout design add to the CD variation and failure rate of a targeted CD for a feature. Imaging material processing is complex and difficult to model in OPC designs. Further, other post patterning processes such as etch and cleaning operations are equally difficult to model in OPC designs and cause substantial CD variation.

In the prior art, OPC models rely on standardized symmetrical structures with various fixed pitches. As illustrated in prior art FIG. 1, anchor data 100 comprises a set of features or line elements 115 in a standard symmetrical structure. The features 115 and spaces 120 are evenly distributed having a fixed pitch 125 that may vary as needed between several such anchor data structures 100 (wherein each set of anchor data is symmetrical). These symmetrical structures 100 work well for correcting optical effects via OPC where the RMS errors produced may be averaged over a large sampling set. However, such prior art methods and symmetrical structures 100 do not provide adequate correction for post processing such as etch and clean processes or imaging material processing such as photoresist processes. In addition, standardized symmetrical structures 100 employed in prior art OPC models do not distinguish between the various asymmetric structures that may be relevant to the device layout.

Accordingly, as illustrated in FIG. 2, a typical design layout 200 may possess asymmetrical structures 205 in addition to symmetrically spaced structures similar to structure 100 of FIG. 1. Asymmetric structures 205 comprise, for example, both dense spacing P1 and semi-isolated feature spacing P2. As a result, the asymmetrical structures 205 may show higher failure rates for missing targeted CDs on silicon when these structures are sized utilizing an OPC model based primarily on standard symmetrical structures (e.g., 100 of FIG. 1) having a fixed pitch.

Accordingly, there is a need for a method of optimizing the size of features on silicon utilizing an OPC design that incorporates the effects of post pattern processing and both symmetric and asymmetric feature density spacing effects wherein feature CD and device performance may be improved in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to a method and system of optimizing feature sizing in photolithographic mask data as a result of post pattern processes using symmetric and asymmetric structures that provide feature density based effects, wherein critical dimensions (CDs) of layout features are measured to accurately assess or otherwise determine the corrections for the OPC model to optimize the feature sizes in the fabrication of semiconductor devices. The method is applicable to silicon wafer fabrication and other such fabrication processes in the manufacture of semiconductor devices.

In one aspect of the invention, a layout mask is designed with a plurality of symmetric and asymmetric test structures formed thereon, and the layout mask is used to generate OPC data. One or more wafers are then fabricated using the layout mask, the fabricating including image material processing (e.g., photo resist development processes) and substrate material processing (e.g., etch and clean processes). Critical dimensions of the resultant wafer features are then measured at each stage, for example, to obtain CD data that reflects the impact of image material processing and substrate processing and the symmetric and asymmetric layout effects. The difference between the desired CD and the measured CD is determined and used to generate an OPC model to create OPC data or modify OPC data already being employed.

The inventors of the present invention have realized that the CD of features with asymmetric loading process differently (e.g., imaging processing and/or substrate processing) than the CD of features that are symmetrically loaded. Thus, the CD of features having unequal spacing on either side thereof (asymmetric) differ from the CD of features with substantially equal spacing between neighboring features (symmetric).

In one or more aspects of the present invention, the OPC model is generated by optimizing the convolution kernels, for example in the OPC software to map the optical response for features with various fixed pitches (symmetrical data), and for features with asymmetric data or edge data, to map the density based response due to imaging material processing (e.g., lithographic, photoresist effects), and to map the density based response due to substrate material processing (e.g., etch and clean processes). Thus one or both density based responses are used to generate the OPC data de novo, or modify OPC data already being utilized.

Thus, the optical, resist, etch, and cleaning processing effects, for example, which result from both high and low density features are measured and utilized to create a model used to generate or correct OPC data to optimize the layout feature sizes according to one exemplary aspect of the invention.

In another aspect of the present invention, the OPC model or correction software in the form of convolution kernels may be optimized by assessing, for example, the critical dimensions of multiple symmetric structures of varying pitch and mapping them to the optical response of the OPC data. The OPC model may further be optimized by assessing the critical dimensions of asymmetric structures (e.g., various features having varying degrees of asymmetry) and mapping them to the density based response due to the imaging material processing (e.g., lithographic, photoresist effects). Finally, the model is optimized by the density based response due to substrate material processing (e.g., etch and clean processes). The developed model may then be employed to generate OPC data for an input layout data set that accounts for symmetrical and asymmetrical feature loading as well as the degree thereof, and may also account for the impact of such loading on subsequent material processing such as etch and post-etch clean operations.

In yet another aspect of the present invention, the symmetrical structures are utilized having a fixed pitch, such as a plurality of gratings, wherein each grating has a fixed pitch and wherein the fixed pitch of each grating differs between gratings.

In another aspect of the present invention, the asymmetric structures comprise two or more asymmetric features having a dense feature spacing and a semi-isolated or an isolated feature spacing. Alternatively, the degrees of asymmetrical loading may be varied incrementally in smaller increments to obtain a sufficiently high degree of granularity in asymmetrical loading conditions, as may be desired.

In still another aspect of the invention, critical dimension (CD) measurements are made using a measurement system after imaging material processing and after substrate material processing one or more wafers.

In yet another aspect of the present invention, the CD measurement data is graphically or otherwise evaluated or characterized based on the CD differences between the desired feature size CD and the respective measured feature size CD to be used for OPC data correction.

In one implementation, for example, the OPC data is corrected for the mask layout based on the CD difference characterization to optimize the feature size as a result of the wafer fabrication and processing. The OPC data may be corrected, for example, by generating OPC data or modifying an OPC design used in an OPC corrected mask layout to correlate with the smallest difference between the desired feature size CD and the respective measured feature size CD.

In the past, only standard symmetrical structures with one or more fixed pitches were measured and used for anchor data and fed back to the OPC model for OPC data correction as a result of optical effects. The present invention, however, provides an OPC model that accounts for both symmetric and asymmetric structures having symmetric and asymmetric feature spacings, respectively. The method employs monitoring such additional data to make the OPC model more sensitive to density effects that are observed after patterning and etch processing. The method, moreover, may advantageously achieve significantly minimized variations from the desired feature sizing and a corresponding improvement in device performance (e.g., static Iddq (off-state leakage current), and yield roll-off with decreasing pitch).

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
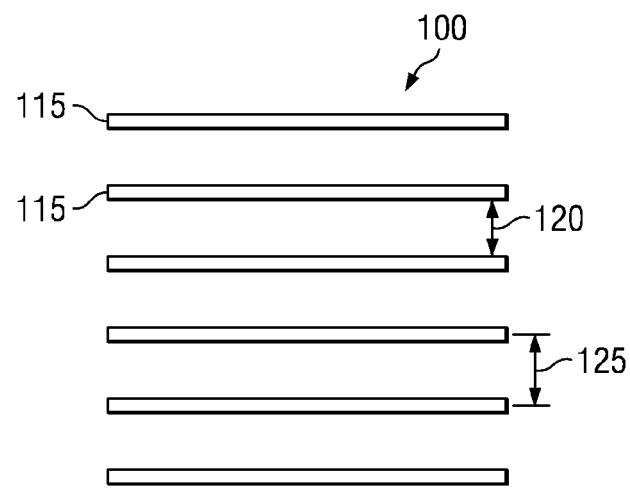
FIG. 1 is a simplified view of a standard symmetrical structure having a fixed pitch that provides anchor data for optical proximity correction of photolithographic mask data used in the fabrication of semiconductor wafer manufacturing.
Figure 2:
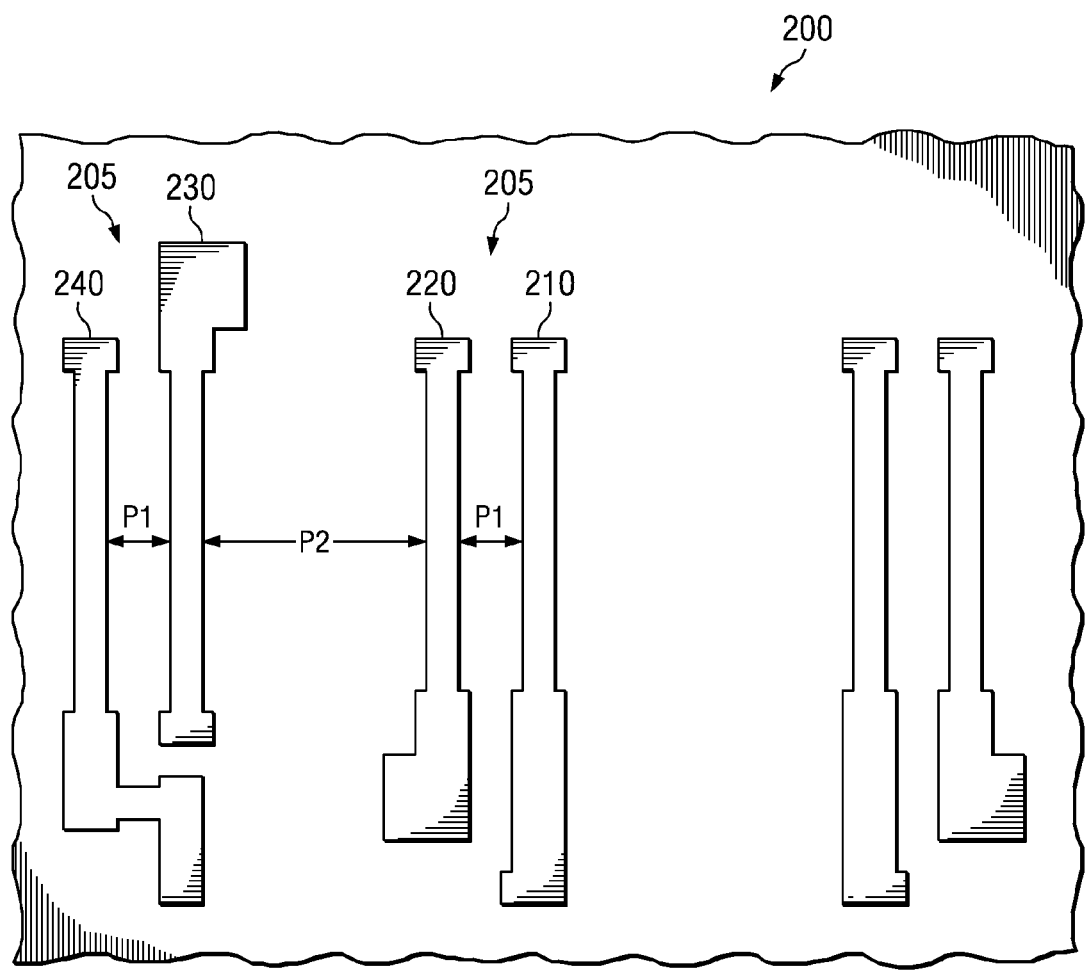
FIG. 2 is a partial plan view of a mask for a product design, wherein asymmetrical structures are illustrated comprising dense and semi-isolated feature spacings.

The present invention will now be described with reference to the attached drawings, wherein like reference numerals are used to refer to like elements throughout. The invention provides a method and system for feature size optimization in the fabrication of semiconductor wafers and devices, wherein post processing critical dimensions (CD) of anchor data from both symmetric and asymmetric structures are measured to capture feature density and processing effects. The CD measurements are then assessed and/or characterized and employed to generate an OPC model for correction of mask data, in order to optimize the measured feature size to the original design size.

As indicated above, the inventors of the present invention have discovered and/or appreciated that the CD of asymmetric features differs from the CD of symmetric features and that such variations are further impacted by post imaging processing such as etching, post-etch clean, etc. This characteristic may be thought of as a feature density effect, as the features near the edge of a structure are somewhat more isolated or semi-isolated from an adjacent feature and therefore are less densely spaced. Conversely, those features near the center of a repeating or multi-feature structure may tend to be more densely spaced relative to each other. Thus, the inventors have realized that the CD of asymmetric features (e.g., isolated on only one side thereof) is different than the CD of symmetric features (e.g., a feature in the center of a grid array that is evenly spaced between neighboring features).

Exemplary implementations are hereinafter illustrated and described in the context of generating process models for performing proximity correction of photolithographic mask designs utilized in the fabrication, and post processing semiconductor wafers and devices, wherein convolution kernels may be used to simulate image formation, and wherein the structures illustrated are not necessarily drawn to scale. It will be appreciated that the invention may be employed in mapping imaging effects, mapping imaging material processing effects, as well as in mapping substrate etching and cleaning effects and other such processes apart from the exemplary processes described and illustrated herein. These and other benefits will become more apparent as the following figures are described. The following discussion will further establish some of the problems and issues relating to layout density associated with the proximity correction of mask designs used in wafer and device fabrication.

As indicated above, in photolithography, light passing through the reticle is refracted and scattered by the edges of the chrome mask patterns of the reticle causing the projected image to exhibit some rounding and other optical distortion. As feature scaling trends continue down to around 90 nm areas or less, CD variations of features may no longer be ignored in present day circuit layouts, particularly as feature sizes approach the wavelength of the radiation employed in the photolithographic process.

In addition, variations in the photoresist and other such imaging material processing cause damage to the features as fabricated, and degradations from the layout design. This damage may be due to diffraction and scattering of the distorted illumination pattern, which adds to the CD variation and failure rate of a targeted CD for a feature. Such imaging material processing has been complex and difficult to model in OPC designs. Further, other post imaging patterning processes such as etch and cleaning operations are equally difficult to model in OPC designs, yet cause substantial CD variation from the desired CD. Typical integrated circuit features affected by these CD variations, degradations and failures include polysilicon gate regions, vias in dielectrics, etc. As a result, integrated circuit performance is often degraded.

In response to these problems and issues, an improvement to the reticle correction technique or optical proximity correction (OPC) has been developed. Accordingly, one aspect of the present invention provides a method for generating process models for performing optical proximity correction using convolution kernels to simulate image formation. One implementation of the present invention accomplishes this by mapping imaging effects, imaging material processing effects, and substrate material processing effects into the OPC model kernels. In contrast to the prior art, the method employs a density based response of asymmetrical features and structures to generate an OPC model to correct (compensate) the feature size CD to better replicate the design layout. Thus, the CDs or sizes of the features are optimized.

In one aspect of the invention, a layout mask is designed containing a plurality of different symmetric and asymmetric structures. One or more wafers are then processed according to the symmetric and asymmetric layout, the processing including image material processing (e.g., photo resist development processes) and substrate material processing (e.g., etch and clean processes). Critical dimensions of the resultant wafer features are then measured at one or both stages (e.g., after imaging processing and the substrate material processing) to obtain CD data that reflects the impact of feature density in post processing as well as the symmetric and asymmetric layout effects. The difference or deviation between the desired CD and the measured CD of the wafer features is then calculated, plotted, mapped, or otherwise determined for the generation of OPC data or for the correction of the OPC data already employed (e.g., by way of correction to corresponding convolution kernels of the OPC model).

Figure 3:
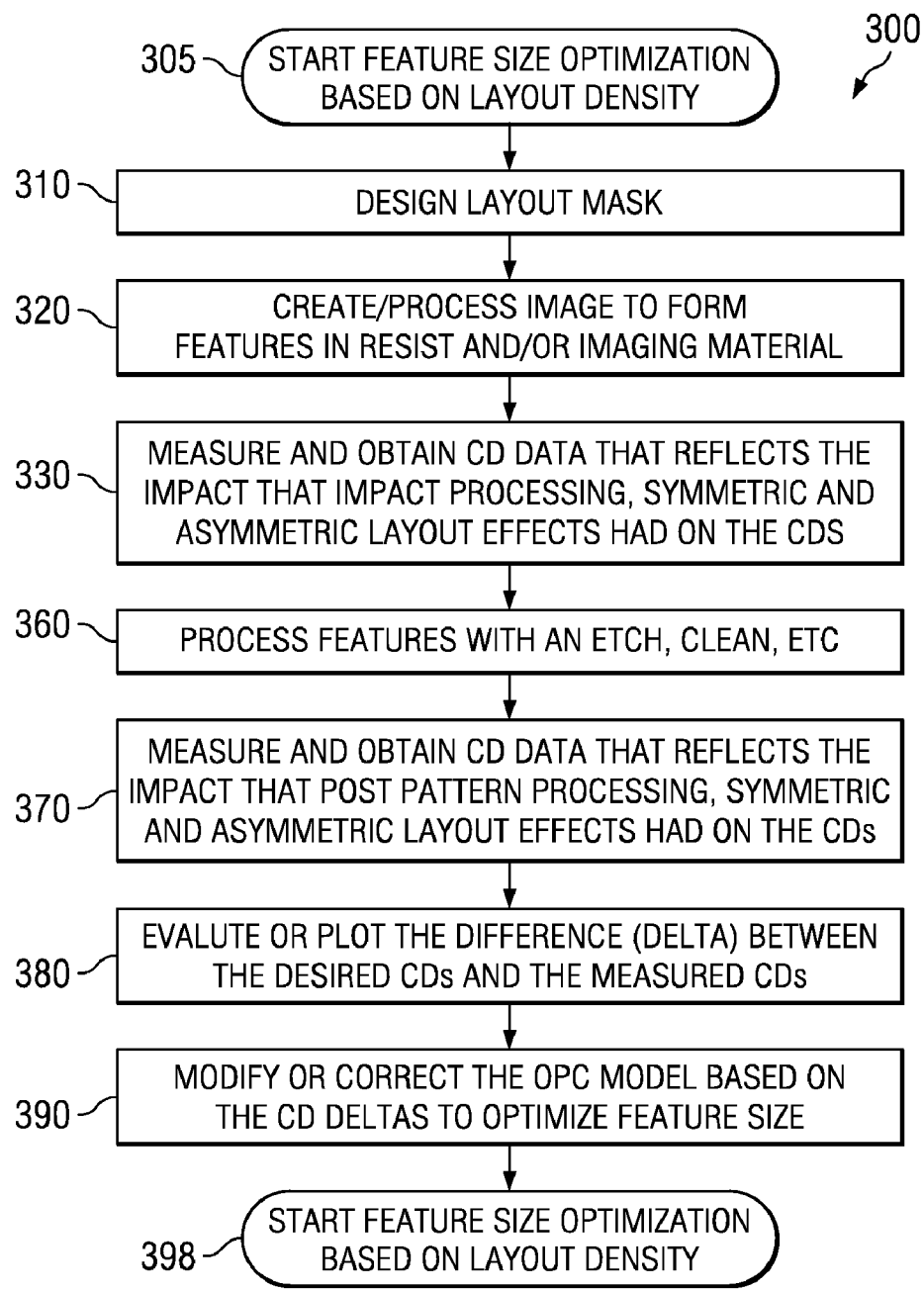
FIG. 3 is a flow diagram illustrating an exemplary method of optimizing the feature size in the fabrication of semiconductor wafer manufacturing in accordance with one or more aspects of the present invention, wherein post processing anchor data from both symmetric and asymmetric structures are measured to capture feature density effects for OPC model correction of the mask data.

One such method 300 is illustrated in FIG. 3, representing a method of optimizing feature sizes as a result of layout density effects in accordance with several aspects of the present invention. Although the exemplary method 300 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and transistor devices illustrated and described herein as well as in association with other apparatus and structures not illustrated.

Method 300 comprises an exemplary feature size optimization method that may be used in the fabrication of semiconductor device wafers, the method beginning at 305. A layout mask is designed and provided at 310, wherein the test mask layout comprises a plurality of differing symmetric and asymmetric features. For example, a plurality of symmetric grid arrays may be included that each have a unique pitch that differs from the others. Further, the asymmetric features may comprise a plurality of features having unequal spacing therebetween, wherein a degree of asymmetry is varied over a substantially wide range and at a level of granularity dictated by a user.

Image material processing is performed at 320, wherein a photoresist overlying a substrate (e.g., a semiconductor wafer) is exposed with radiation using the test mask and subsequently developed using a developer solution. Alternatively, image material processing includes any form of pattern transfer such as E-beam, printing, etc., and such variations are contemplated as falling within the scope of the present invention. At 330 critical dimension measurements are made of the resultant symmetric and asymmetric structures formed in the resist. The one or more wafers are then fabricated or further processed, the fabricating including substrate material processing (e.g., etch and clean processing) at 360.

At 370, the critical dimensions of the fabricated wafer features are measured to obtain CD data that reflects the impact that feature density effects had in post processing as well as the differing effects on the symmetric and asymmetric features. At 380, the difference or deviation between the desired CD and the measured CD of the layout features is, for example, evaluated, plotted, or mapped for creation of an OPC model that operates to minimize the differences between the desired feature and the resultant feature. Alternatively, if OPC has already been applied to the mask layout based on an expected result or based on an earlier characterization as discussed above, the collected data may be employed to alter the current OPC model to generate corrected OPC data. In the above manner, it can be appreciated that the present invention contemplates generating an OPC model with a single test mask or alternatively contemplates forming another test mask and performing another round of fabrication and evaluation to further optimize the OPC model based thereon.

Figure 4:
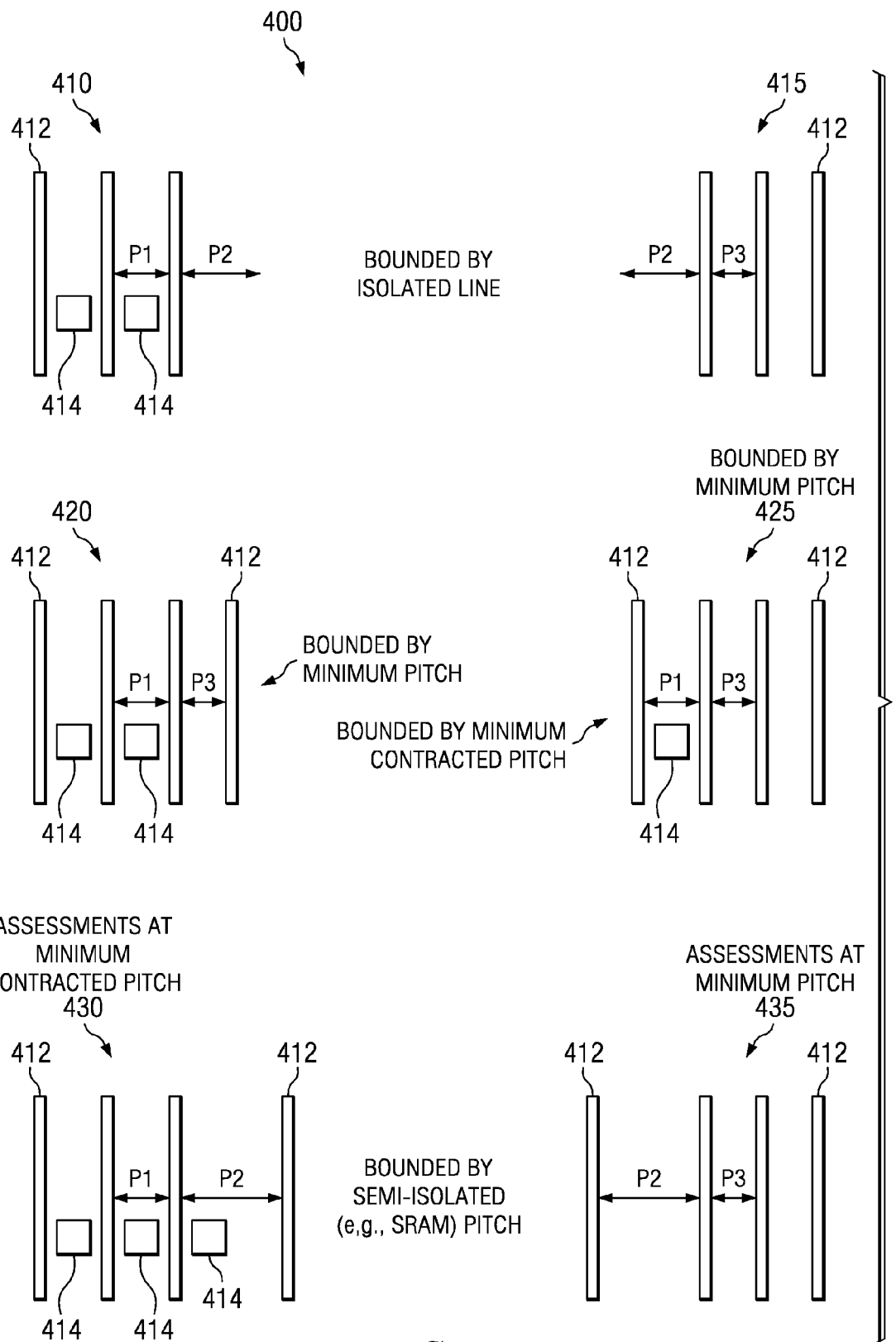
FIG. 4 is a simplified diagram of several design rules used in the assessment of symmetric and asymmetric structures for both contacted pitch and non-contact pitch assessments such as may be applied to feature CD measurements used in accordance with the present invention of FIG. 3.

Thereafter the method 300 ends at 398, wherein a desired mask layout is input to the new, generated model, resulting in a mask layout output that contains OPC corrected data, wherein the OPC data, unlike the prior art, accounts for asymmetrical loading and post imaging processing effects FIG. 4 illustrates several exemplary test structures used in the evaluation of symmetric and asymmetric structures for both contacted pitch and non-contact pitch conditions such as may be applied to feature CD measurements used in accordance with method 300 of the present invention of FIG. 3. Contacted pitch design rules 410, 420, and 430 comprise features or lines 412 of an asymmetrical structure having feature spacings P1, P2 and P3.

As described previously, an asymmetrical structure occurs when a spacing P2 is not equal to P1 or P3. Structures 410 and 415 illustrate a structure that is isolated on one side (P2 approaches infinity) and bounded on the other side (P1 representing a minimum contacted pitch and P3 representing in this example a minimum non-contacted pitch). In the above examples, P2>>P1, P3, however, other structures may be provided having other variations.

Structures 420 and 425 illustrate structures bounded by a minimum pitch allowable, that is, on one side with a minimum contacted pitch and their other side by a minimum non-contacted pitch, wherein such bounding can occur on opposite sides. In the illustrated example, P3<P1. Finally, structures 430 and 435 illustrate structures bounded by a semi-isolated pitch (e.g., an SRAM pitch), wherein P2 is greater than P1. As may be appreciated, the structures of FIG. 4 merely illustrate a few differing asymmetric structures that may be employed in conjunction with the present invention. It should be understood that a large number of differing asymmetric structures of differing amounts of asymmetry may be employed and are contemplated as falling within the scope of the present invention.

The inventors have also discovered that the method of the present invention is useful in test layouts that describe features of varying sizes and pitch to capture the optical effects, and that describe features of fixed pitch (dependent on design layout) with varying asymmetry to capture density (spacing) effects. Data collected that characterize such effects, the patterning and the post patterning processing may then be used, for example, to correct and optimize the convolution kernels of the corresponding OPC models based on both symmetrical structures with fixed pitch and asymmetrical structures having specific or asymmetric pitches.

It will be noted that the various aspects of method 300 illustrated and described above is exemplary in nature, and that many alternative orderings of various optimization steps may be made in accordance with the spirit and scope of the present invention. In addition, the invention is not limited to the specific wafer processes discussed herein, and may be implemented in association with other processes wherein CD errors are induced due to a density dependent processes in the fabrication of semiconductor wafers and products. The invention is also not limited to the use of silicon wafers, and may be implemented in association with the manufacture of various semiconductor devices, masks/reticles, screen printing, or other image transfer processes that have density based sensitivities, wherein the various aspects thereof may be applied.

In accordance with another aspect of the present invention, a feature optimization system is provided comprising a semiconductor wafer, a design layout mask, a symmetrical feature structure having fixed pitch feature spacings, and an asymmetrical feature structure having a dense feature spacing and a semi-isolated feature spacing. The system also includes a feature measurement system operable to measure critical dimensions of the wafer features. The system further comprises an optical proximity correction model operable to map imaging effects using the symmetrical feature structure, to map imaging material processing effects and substrate post processing effects from the asymmetrical feature structure, and to correct the optical proximity correction model based on critical dimension measurements provided by the feature measurement system.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A computer-implemented method for generating an optical proximity correction model for a mask layout having an asymmetric feature structure, the method comprising:

fabricating a mask comprising a plurality of symmetric and asymmetric test structures thereon;

image processing one or more semiconductor wafers using the fabricated mask to create a plurality of symmetric and asymmetric resist structures overlying the one or more wafers;

measuring at least one critical dimension of the symmetric resist structures and the asymmetric resist structures, thereby generating symmetric and asymmetric critical dimension data;

evaluating a difference between a desired feature size of the symmetric and asymmetric structures and the measured feature size of the symmetric and asymmetric structures; and generating an optical proximity correction model based on the difference evaluation;

wherein the optical proximity correction model comprises optical proximity correction convolution kernels configured to map an optical response for symmetric and asymmetric features based on the difference evaluation, wherein the mapping of the optical response for the symmetric and asymmetric features based on the difference evaluation comprises: optimizing a first of the optical proximity correction convolution kernels based on the critical dimension differences between the measured and desired symmetric features determined in the difference evaluation, and optimizing a second of the optical proximity correction convolution kernels based on the critical dimension differences between the measured and desired asymmetric features determined in the difference evaluation.

2. The method of claim 1, further comprising:

processing the one or more semiconductor wafers using the resist structures lying thereover, thereby generating symmetric and asymmetric processed structures associated with the one or more semiconductor wafers;

measuring at least one critical dimension of the symmetric and asymmetric processed structures associated with the one or more semiconductor wafers;

evaluating a difference between a desired feature size of the symmetric and asymmetric processed structures and the measured feature size of the symmetric and asymmetric processed structures; and using the difference evaluation of the processed structures in generating the optical proximity correction model.

3. The method of claim 2, wherein the optical proximity correction convolution kernels are configured to map a density based response for symmetrical and asymmetrical features based on the difference evaluation of the symmetric and asymmetric processed structures.

4. The method of claim 1, wherein the asymmetric feature resist structure comprises two or more features.

5. The method of claim 4, wherein the two or more asymmetric resist structures comprise a dense feature spacing and a semi-isolated or an isolated feature spacing.

6. The method of claim 5, wherein the two or more asymmetric resist structures are separated by a dense feature spacing, and the semi-isolated or the isolated spacing is measured from an outer edge of one of the asymmetric resist structures to a semi-isolated or an isolated adjacent resist structure.

7. The method of claim 1, wherein the one or more wafers comprise a silicon substrate.

8. The method of claim 1, wherein the measuring at least one critical dimension of the asymmetric resist structures comprises:

using a measurement system to measure corresponding critical dimensions after image processing the one or more wafers.

9. The method of claim 1, wherein evaluating the difference between the desired feature size and the measured feature size comprises:

evaluating the differences based on the respective feature size measurements; and determining a smallest difference between the desired feature size and the respective measured feature size to be used for optical proximity correction data correction.

10. An optical proximity correction data generation processor implemented system, comprising:

a process comprising an optical proximity correction model operable to receive a design layout as input data and generate a mask design layout as output data, wherein the mask design layout includes optical proximity correction data associated with the design layout that evaluates a difference between a desired and measured feature size of a plurality of symmetric and asymmetric structures on a semiconductor wafer associated with the design layout, wherein the measured feature size of the plurality of symmetric and asymmetric structures is obtained by fabricating the plurality of symmetric and asymmetric test structures on the semiconductor wafer, and measuring at least one critical dimension of the symmetric resist structures and the asymmetric resist structures;

wherein the optical proximity correction model comprises optical proximity correction convolution kernels configured to map a density based optical response for symmetric and asymmetric features based on the difference evaluation, wherein the mapping of the density based optical response for the symmetric and asymmetric features based on the difference evaluation comprises: optimizing a first of the optical proximity correction convolution kernels based on the critical dimension differences between the measured and desired symmetric features determined in the difference evaluation, and optimizing a second of the optical proximity correction convolution kernels based on the critical dimension differences between the measured and desired asymmetric features determined in the difference evaluation.

11. The optical proximity correction data generation system of claim 10, wherein the optical proximity correction model is further operable to generate the mask design layout, wherein the mask design layout includes optical proximity correction data that accounts for influences of subsequent material processing on features associated with the design layout.

12. A computer-implemented method for generating an optical proximity correction model for a mask layout, comprising:
 fabricating a test mask comprising a plurality of symmetric and asymmetric test structures thereon;
 processing a semiconductor wafer using the test mask, thereby forming a plurality of symmetric and asymmetric test structures on the wafer corresponding to the test structures on the test mask;
 evaluating the plurality of processed symmetric and asymmetric test structures on the semiconductor wafer; and
 generating an optical proximity correction model based on the evaluation of the processed symmetric and asymmetric test structures;
 wherein the optical proximity correction model comprises optical proximity correction convolution kernels configured to map a density based optical response for symmetric and asymmetric features based on the evaluation, wherein the mapping of the density based optical response for the symmetric and asymmetric features based on the difference evaluation comprises: optimizing a first of the optical proximity correction convolution kernels based on the critical dimension differences between the measured and desired symmetric features determined in the difference evaluation, and optimizing a second of the optical proximity correction convolution kernels based on the critical dimension differences between the measured and desired asymmetric features determined in the difference evaluation.

13. The method of claim 12, wherein the processed test structures comprise a plurality of symmetric and asymmetric resist structures overlying the semiconductor wafer.

14. The method of claim 12, wherein the processed test structures comprise a plurality of symmetric and asymmetric structures associated with the semiconductor wafer.

15. The method of claim 14, wherein the symmetric and asymmetric structures associated with the semiconductor wafer comprise one of a processed dielectric layer, a processed polysilicon layer, and a processed portion of the semiconductor wafer.

16. The method of claim 12, wherein evaluating the plurality of processed symmetric and asymmetric structures comprises:
 measuring a critical dimension of the processed symmetric and asymmetric structures; and
 determining a difference between the measured critical dimension of the processed symmetric and asymmetric structures and a desired critical dimension thereof associated with the test structures.

* * * * *